US009698760B1

(12) United States Patent
Tonietto

(10) Patent No.: US 9,698,760 B1
(45) Date of Patent: Jul. 4, 2017

(54) CONTINUOUS-TIME ANALOG DELAY DEVICE

(71) Applicant: MARVELL INTERNATIONAL LTD., Hamilton (BM)

(72) Inventor: Riccardo Tonietto, Valencia (ES)

(73) Assignee: MARVELL INTERNATIONAL LTD. (BM)

( * ) Notice: Subject to any disclaimer, the term of this patent is extended or adjusted under 35 U.S.C. 154(b) by 49 days.

(21) Appl. No.: 14/608,455

(22) Filed: Jan. 29, 2015

Related U.S. Application Data

(60) Provisional application No. 61/934,566, filed on Jan. 31, 2014.

(51) Int. Cl.
  *H03K 17/284* (2006.01)
  *H03H 19/00* (2006.01)
  *G11B 20/10* (2006.01)

(52) U.S. Cl.
  CPC ..... *H03H 19/008* (2013.01); *G11B 20/10222* (2013.01); *H03K 17/284* (2013.01)

(58) Field of Classification Search
  None
  See application file for complete search history.

(56) References Cited

U.S. PATENT DOCUMENTS

| | | | | |
|---|---|---|---|---|
| 3,801,923 A * | 4/1974 | Russell | ............... | H03F 3/45071 330/255 |
| 5,012,142 A * | 4/1991 | Sonntag | ................ | H03K 5/133 327/158 |
| 5,051,630 A * | 9/1991 | Kogan | ................... | H03K 5/133 327/262 |
| 5,283,631 A * | 2/1994 | Koerner | ............ | G01R 31/2841 326/121 |
| 5,317,200 A * | 5/1994 | Nishiyama | ............. | H03H 11/20 327/231 |
| 5,416,436 A * | 5/1995 | Rainard | ................. | H03K 5/131 327/270 |
| 5,489,878 A * | 2/1996 | Gilbert | ..................... | H03B 5/20 331/115 |
| 5,519,265 A * | 5/1996 | Latham, II | ......... | H03H 11/1291 327/101 |
| 5,644,262 A * | 7/1997 | Bazes | .................... | H03K 5/131 327/264 |
| 5,736,909 A * | 4/1998 | Hauser | ................... | H03H 15/00 333/139 |
| 5,742,087 A * | 4/1998 | Lidow | ................ | H01L 29/0615 257/339 |

(Continued)

*Primary Examiner* — Thomas J Hiltunen

(57) ABSTRACT

Systems, methods, and other embodiments associated with a continuous-time analog delay device are described. According to one embodiment, a device includes a first terminal connected to an input line to receive an input signal. The device includes a first differential pair of transistors comprising a first transistor and a second transistor, wherein a gate of the second transistor is connected to the first terminal. The device includes a second differential pair of transistors comprising a third transistor and a fourth transistor, wherein a gate of the third transistor is connected to the first terminal. The device includes a first load connected to a drain of the third transistor. The device includes a second load connected to a drain of the fourth transistor. The device includes at least one capacitor connected in parallel between the first load and the second load.

16 Claims, 7 Drawing Sheets

(56) References Cited

U.S. PATENT DOCUMENTS

| | | | | |
|---|---|---|---|---|
| 5,828,258 A | * | 10/1998 | Ooishi | G11C 11/4076 |
| | | | | 327/276 |
| 6,359,503 B1 | * | 3/2002 | Alini | H03H 11/0422 |
| | | | | 327/103 |
| 6,426,680 B1 | * | 7/2002 | Duncan | H01F 17/0006 |
| | | | | 257/E27.046 |
| 6,441,671 B1 | * | 8/2002 | Rastegar | H03B 5/02 |
| | | | | 327/101 |
| 6,734,817 B2 | * | 5/2004 | Naka | H03M 1/002 |
| | | | | 330/129 |
| 7,132,885 B2 | * | 11/2006 | Capofreddi | H03F 1/0205 |
| | | | | 330/107 |
| 7,302,461 B2 | * | 11/2007 | Mukherjee | H03F 3/45183 |
| | | | | 327/276 |
| 7,315,199 B2 | * | 1/2008 | Oishi | H03F 1/08 |
| | | | | 327/552 |
| 7,598,811 B2 | * | 10/2009 | Cao | H03F 3/45183 |
| | | | | 330/254 |
| 7,800,437 B2 | * | 9/2010 | Khoury | H03F 3/217 |
| | | | | 330/10 |
| 7,924,102 B2 | * | 4/2011 | Hinrichs | H03F 3/45659 |
| | | | | 327/266 |
| 7,970,811 B2 | * | 6/2011 | Shen | H03H 21/0001 |
| | | | | 708/819 |
| 8,466,738 B2 | * | 6/2013 | Park | H03F 3/211 |
| | | | | 327/403 |
| 8,798,127 B2 | * | 8/2014 | Ding | H04L 25/03885 |
| | | | | 375/232 |

* cited by examiner

CONTINUOUS-TIME ANALOG DELAY DEVICE

CROSS REFERENCE TO RELATED APPLICATIONS

This patent disclosure claims the benefit of U.S. Provisional Application Ser. No. 61/934,566 filed on Jan. 31, 2014, which is hereby wholly incorporated by reference.

BACKGROUND

Analog delay circuits are circuits placed along a path of an analog signal to delay the analog signal by a certain predefined amount of time. In general, an analog delay circuit uses filters or similar elements to delay the analog signal.

However, the filters affect the analog signal by causing distortion and attenuation in the analog signal, which is undesirable. Consequently, delaying the analog signal by longer amounts of time can cause even further difficulties from using multiple filters that compound the attenuation thereby degrading the signal.

SUMMARY

In general, in one aspect this specification discloses a device. The device includes a first terminal connected to an input line to receive an input signal. The device includes a first differential pair of transistors comprising a first transistor and a second transistor, wherein a gate of the second transistor is connected to the first terminal. The device includes a second differential pair of transistors comprising a third transistor and a fourth transistor, wherein a gate of the third transistor is connected to the first terminal. The device includes a first load connected to a drain of the third transistor. The device includes a second load connected to a drain of the fourth transistor. The device includes at least one capacitor connected in parallel between the first load and the second load. The device includes a second terminal connected to the input line, and wherein a gate of the fourth transistor is connected to the second terminal. The device includes a third differential pair of transistors comprising a fifth transistor and a sixth transistor, wherein a gate of the fifth transistor is connected to the second terminal.

In general, in another aspect, this specification discloses an apparatus. The apparatus includes filter logic configured to adjust an analog signal to produce an adjusted signal according to a timing variable configured by a delay unit. The timing variable is a ratio between a total capacitance of connected capacitors in the delay unit and a transconductance of transistors in the delay unit. The apparatus includes differential logic configured to subtract the analog signal from the adjusted signal to generate, in continuous-time, an output signal with a time delay that is a function of the timing variable.

In another aspect, the delay includes an array of capacitors connected in parallel, wherein each capacitor has an associated capacitance. The delay unit includes delay logic connected to the array of capacitors and configured to individually activate capacitors in the array to dynamically modify the total capacitance. The delay logic is configured to selectively activate capacitors as a function of a control signal.

In another aspect, the apparatus is a high speed wire-line communication device and the input signal is a communication signal processed by the high speed wire-line communication device.

In another aspect, the apparatus is a hard-disk drive and the input signal is an analog signal in a read channel of the hard-disk drive.

In general, in another aspect, this specification discloses a method. The method includes adjusting an analog signal to produce an adjusted signal according to a timing variable. The timing variable is a ratio between a total capacitance of connected capacitors and a transconductance of transistors. The method includes subtracting the analog signal from the adjusted signal to generate an output signal with a time delay that is a function of the timing variable.

In another aspect, the method includes individually activating capacitors in a parallel array of capacitors of the delay unit to dynamically modify the total capacitance as a function of a control signal.

In another aspect, the adjusting is performed by a circuit that is connected to a high speed wire-line communication device and wherein the input signal is a communication signal.

In another aspect, the adjusting is performed by a circuit that is connected to a hard-disk drive, and wherein the input signal is an analog signal in a read channel of the hard-disk drive.

BRIEF DESCRIPTION OF THE DRAWINGS

The accompanying drawings, which are incorporated in and constitute a part of the specification, illustrate various systems, methods, and other embodiments of the disclosure. Illustrated element boundaries (e.g., boxes, groups of boxes, or other shapes) in the figures represent one example of the boundaries. In some examples, one element may be designed as multiple elements or multiple elements may be designed as one element. In some examples, an element shown as an internal component of another element may be implemented as an external component and vice versa.

DETAILED DESCRIPTION

Described herein are examples of systems, methods, and other embodiments associated with a circuit for providing continuous time delay of an analog signal. In one embodiment, the circuit delays an analog signal by approximating an all pass filter (APF), but without degrading the analog signal. In this way, delay for high bandwidth applications can be provided without degrading the analog signal. For example, applications of the circuit include equalizers in high speed wire-line communications, hard disk drive read channels and so on.

Figure 1:
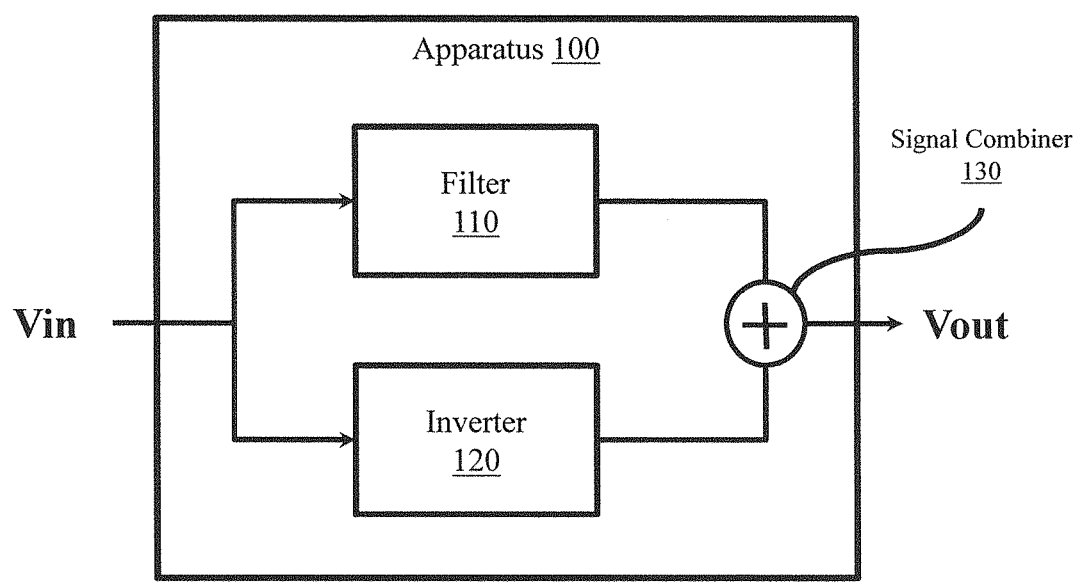
FIG. 1 illustrates one embodiment of an apparatus associated with delaying an analog signal.

With reference to FIG. 1, one embodiment of an apparatus 100 is shown that is associated with broadband analog continuous-time delay. The apparatus 100 illustrates one implementation of an approximation of ideal continuous-time delay. As used within this disclosure, continuous-time refers to a clock-less implementation as opposed to discrete time, which uses circuitry that operates according to a clock signal.

In one embodiment, the apparatus 100 receives an analog signal Vin on an input line that is connected to a filter 110 and an inverter 120. In one embodiment, the inverter 120 is an inverting buffer with a gain of minus one. The filter 110 is, for example, a low-pass filter with a gain of two that in combination with other elements of the apparatus 100 produces an all-pass (AP) function, which may, for example, approximate an ideal all-pass filter. In one embodiment, the filter 110 modifies the analog signal received on Vin by multiplying the signal by a value given by equation (1).

$$\frac{2}{1+Tc*s} \quad \text{Equation (1)}$$

In equation (1), $s=2\pi f$ and $Tc=2*C/gm$. C is a capacitance of a capacitor that is connected in parallel with a load within the filter 110. gm is a transconductance of transistors that form the load in the filter 110. The timing constant Tc will be discussed in further detail subsequently.

The inverter 120 (i.e., inverting buffer) simply inverts the signal provided from Vin. That is, the inverter 120 changes a polarity of the analog signal (e.g., multiplies the signal by −1). Subsequently, an output of both the filter 110 and the inverter 120 are connected to a signal combiner 130. The signal combiner 130 combines results from the filter 110 and the inverter 120 and outputs a result as a time delayed analog signal Vout. The signal Vout is represented by Equation (2).

$$\frac{2}{1+Tc*s} - 1 \quad \text{Equation (2)}$$

Accordingly, the apparatus 100 functions as a practical implementation of an ideal all pass filter represented by Equation (3). Equation (3) is a first order approximation of an ideal time delay of the duration Td, where Td=2*Tc.

$$\left(\frac{1-Tc*s}{1+Tc*s}\right) \quad \text{Equation (3)}$$

Figure 2:
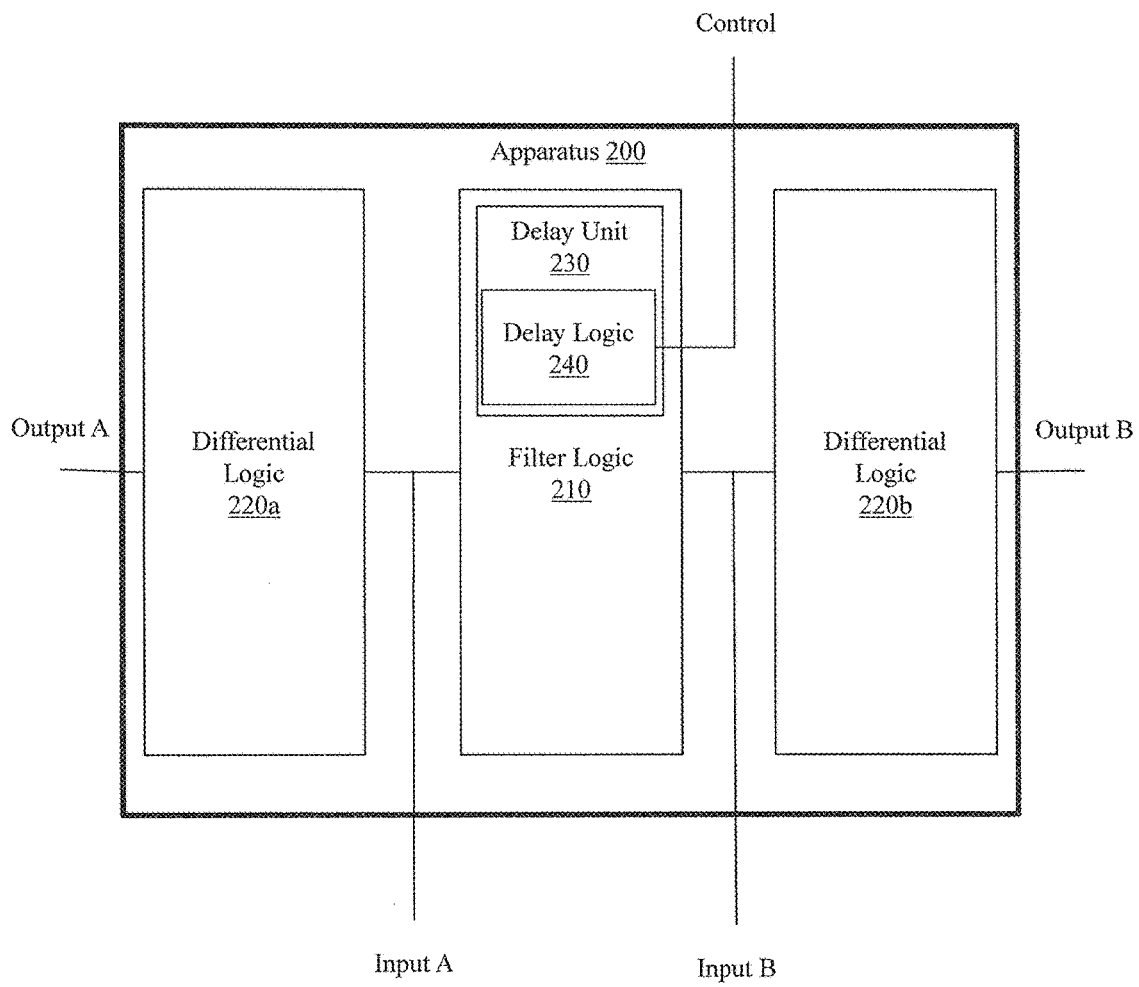
FIG. 2 illustrates one embodiment of an apparatus associated with delaying an analog signal according to programmable continuous time delay.

With reference to FIG. 2, the apparatus 200 illustrates one embodiment of an all pass filter for broadband continuous-time delay that implements Equation (2) similarly to apparatus 100 of FIG. 1. The apparatus 200 includes filter logic 210, differential logic 220a and 220b, and a delay unit 230. The apparatus 200 modifies an analog signal according to equation (3) as shown in equation (4) below.

$$Vout = Vin\left(\frac{1-Tc*s}{1+Tc*s}\right) \quad \text{Equation (4)}$$

For example, Input A and Input B are terminals that provide an analog signal (Vin) to the apparatus 200. In general, Input A provides the signal with a first polarity (e.g., positive) while Input B provides the signal with an opposite polarity (e.g., negative) relative to that of Input A.

In one embodiment, the filter logic 210 implements a low-pass filter according to Equation (1). In one embodiment, the filter logic is configured with a gain of 2 and a cut-off frequency given by fc where fc=1/(2p*Tc). The filter logic 210 is configured to delay the analog signal by an amount according to the timing variable (Td), which is determined by the delay unit 230. In one embodiment, the timing constant (Tc) is determined according to a ratio between a total capacitance of the delay unit 230 and a transconductance of a load in the delay unit 230. The timing variable Td is similarly determined since the timing variable Td is proportional to the time constant Tc. Accordingly, the timing variable Td is determined according to the same ratio of the total capacitance of the delay unit 230 and the transconductance of the delay unit 230.

In one embodiment, the delay unit 230 includes a hard-wired timing variable. That is, the timing variables set upon manufacture. Thus, an amount by which the apparatus 200 delays a signal is fixed. In another embodiment, the delay unit 230 includes an array of capacitors connected in parallel that can be individually activated to change the timing variable (Td) and thereby change the amount of delay imparted to the analog signal.

Accordingly, in one embodiment, the delay unit 230 includes delay logic 240. The delay logic 240 is configured to individually activate capacitors in the array to tune (e.g., adjust) the timing delay Td. By individually activating capacitors, a total capacitance (C) of the delay unit 230 can be changed. Adjusting the timing variable Td modifies a time delay imparted onto the input signal since Td=2*C/gm. In this way, the apparatus 200 can be controlled/programmed to introduce a particular amount of time delay into the analog signal.

In one embodiment, the delay logic 240 is connected to a control terminal that receives a control signal. In general, the control signal may be provided by a controller of a network interface card (NIC), a hard-disk drive (HDD) or another source so that the timing variable Td may be tuned according to a particular application.

Continuing with the apparatus 200, the differential logic 220a and 220b are configured to subtract the analog signal received on the Inputs A and B from an adjusted signal provided by the filter logic 210. The differential logic 220a and 220b provide time delayed signals as Output A and Output B. As in the case of Input A and Input B, Output A and Output B are simply two versions of the output signal with opposite polarities. That is, for example, Output A has a positive polarity, whereas Output B has a negative polarity.

Figure 3:
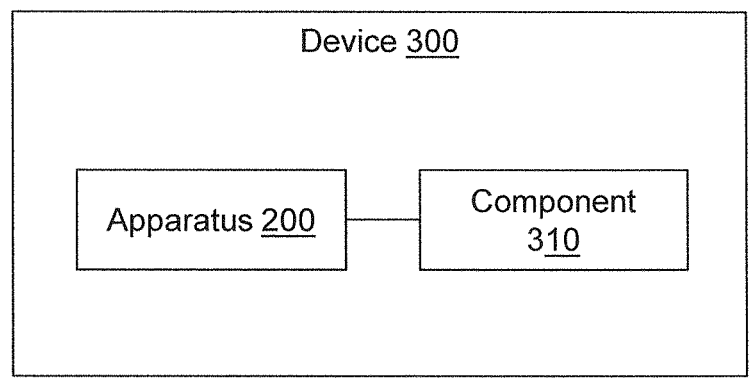
FIG. 3 illustrates one embodiment of a device that implements the apparatus of FIG. 2.

FIG. 3 illustrates one embodiment of a device 300. The device 300 includes the apparatus 200 of FIG. 2 incorporated with a component 310. In one embodiment, the component 310 is a hard-disk drive, a high speed wire-line communication device (e.g., gigabit device), or other device with a high bandwidth (i.e., high data throughput). Accordingly, the apparatus 200 functions to delay an analog signal for the component 310 under high bandwidth conditions without substantially degrading the analog signal. While the apparatus 200 is illustrated as being separate from the component 310, in general, the apparatus 200 is disposed within a single device with the component 310 to delay an analog signal on a read channel in relation to the component 310 or to act as part of an analog transversal equalizer.

Figure 4:
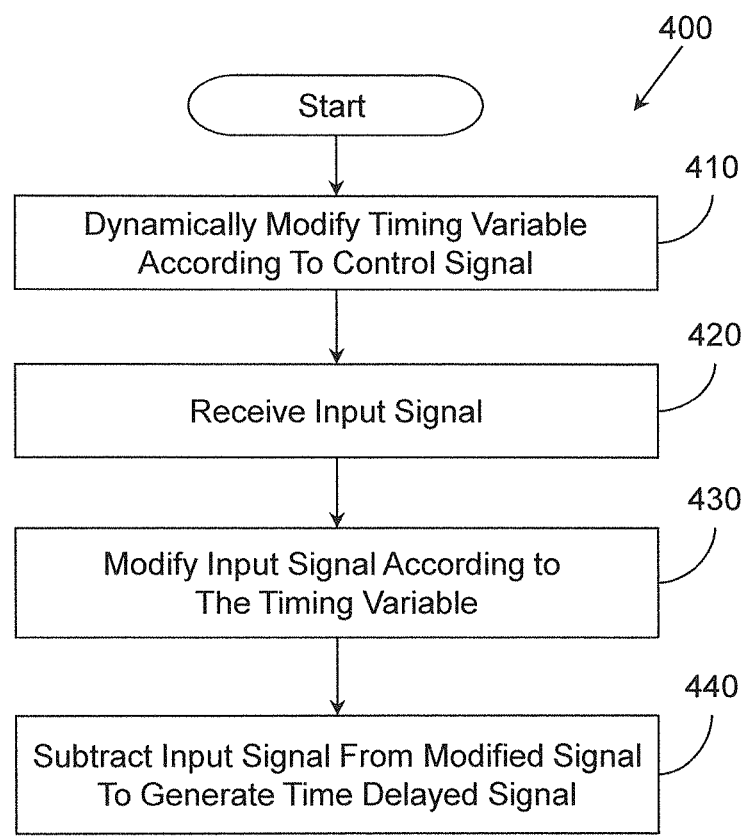
FIG. 4 illustrates one embodiment of a method associated with dynamically modifying delay in a continuous-time delay circuit.

FIG. 4 illustrates one embodiment of a method 400 associated with providing continuous-time delay for an analog signal. In one embodiment, method 400 is performed by the apparatus 200 of FIG. 2. At 410, the timing variable (Td) is dynamically modified according to a control signal.

In one embodiment, the timing variable is modified by selectively enabling capacitors in an array of capacitors to change a total capacitance of a delay unit. In this way, an amount of delay imparted into an analog signal is programmable.

At 420, a signal that is to be delayed is received. In one embodiment, the signal is a communication signal, a read channel signal and so on. While 410 and 420 are discussed in series, of course, the timing variable may be modified at any point during method 400.

At 430, the analog signal received at 420 is modified according to the timing variable (Td). In one embodiment, at 430, the signal is passed through a low-pass filter and the Equation (1) is applied to the signal. Subsequently, at 440, the original analog signal is subtracted from the output of block 430 to provide an output analog signal with a time delay that is a function of the timing variable (Td) that is proportional to the time constant Tc.

Figure 5:
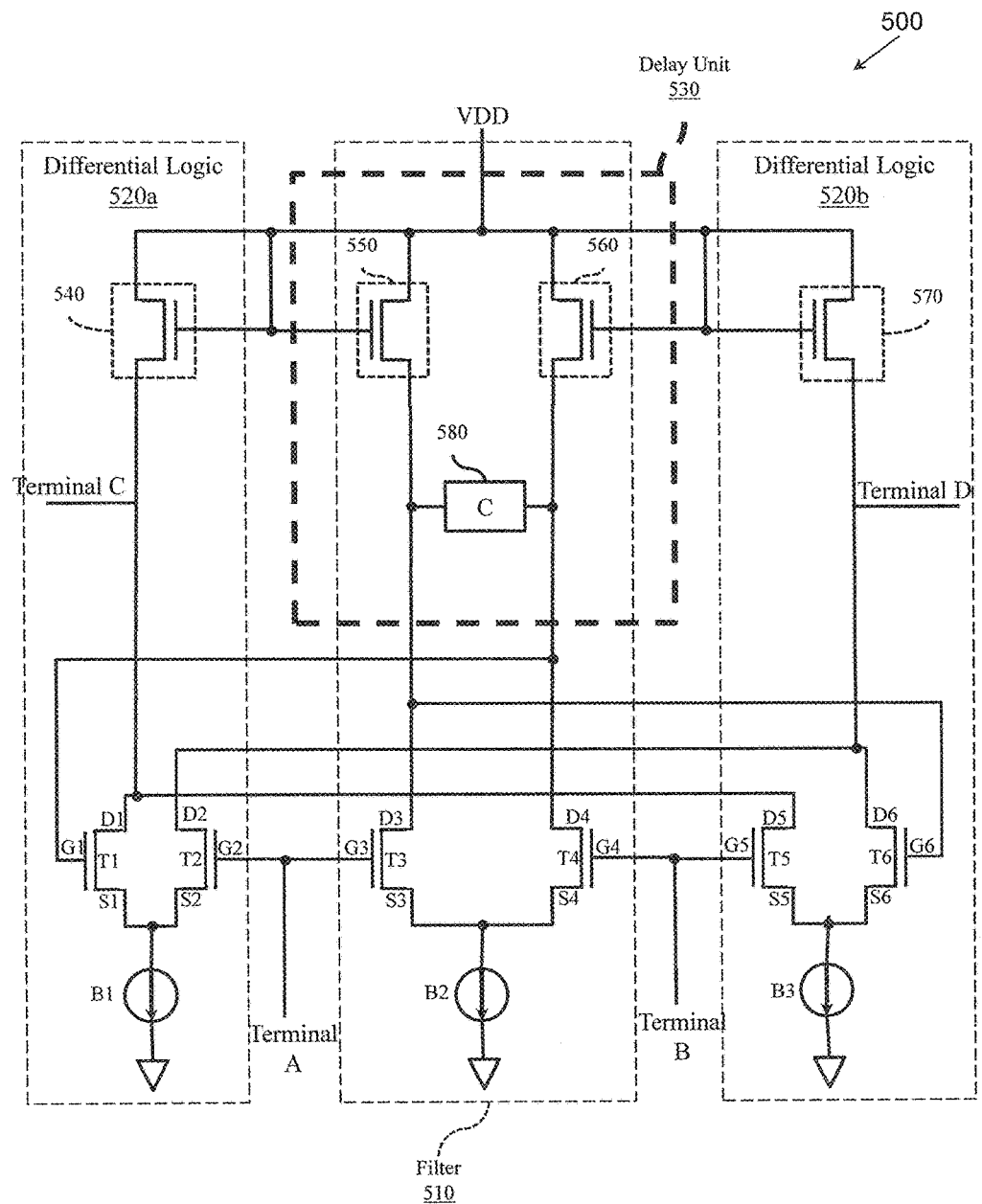
FIG. 5 illustrates one embodiment of a device associated with continuous time delay.

Further aspects of broadband continuous-time delay will be discussed with reference to FIG. 5. FIG. 5 illustrates one embodiment of a delay circuit 500 that implements an all pass filter according to Equation (4) in continuous time. In general, the circuit 500 functions in continuous-time (clockless) versus discrete time (clocked).

The circuit 500 includes three separate functional blocks. The three functional blocks are filter 510 and differential logic 520a and 520b. Additionally, the filter 510 also includes a delay unit 530. The filter 510 modifies an analog input signal received on Terminal A and Terminal B according to Equation (1) while the differential logic 520a and 520b subtract the analog input signal from an output of the filter 510 to provide a delayed version of the original analog signal. The delayed output analog signal is provided on Terminal C and Terminal D respectively.

In one embodiment, the Terminal A and the Terminal B provide the analog input signal in opposing polarities. Similarly, the Terminal C and the Terminal D provide the output signal in opposing polarities.

As shown in FIG. 5, the circuit 500 includes four separate load elements. The load elements are transistors 540, 550, 560, and 570. While the load elements are illustrated as transistors, in one embodiment, the load elements 540, 550, 560, and 570 are resistors. In addition to including transistors 550 and 560, the delay unit 530 also includes at least one capacitor 580. As specified previously, a delay imparted onto the analog input signal is a function of the timing variable (Td). Remember that the time delay provided by timing variable is specified as Td=2*C/gm. C is a total capacitance of the capacitor 580 while gm is a transconductance of 550 and 560. Further details of the delay unit 530 will be discussed subsequently with FIG. 6.

Furthermore, the circuit 500 includes three differential pairs of transistors. The transistors of the differential pairs include transistors T1, T2, T3, T4, T5, and T6. While the transistors are illustrated as n-channel metal oxide semiconductor (nmos) transistors, the transistors may also be p-channel metal oxide semiconductor (pmos) transistors. In one embodiment, a transconductance of each transistor is configured according to a particular ratio between the transistors.

The transconductance ratios among transistors are adjusted in order to achieve the proper gains to implement the transfer function specified in equation (1) with the filter 510 and differential logic 520a and 520b. That is, the transconductance of transistors 540, 570, T1, T2, T3, T4, T5, T6 are the same (e.g., gm). However, the transconductances of transistors 550 and 560 are half (e.g., 0.5*gm) of the transconductances of transistors 540, 570, T1, T2, T3, T4, T5, T6. In one embodiment, if the transistors in circuit 500 are all n-channel metal oxide semiconductors (nmos) or all p-channel metal oxide semiconductors (pmos), trasconductance ratios among the transistors are determined by designing proper ratios among their geometric parameters, such as width and length of device channels.

In either case, the terminal A is connected to gate G2 of transistor T2 and is also connected to gate G3 of transistor T3. Similarly, Terminal B is connected to gate G4 of transistor T4 and is also connected to gate G5 of transistor T5.

Gate G1 of transistor T1 is connected to drain D4 of transistor T4, while gate G6 of Transistor T6 is connected to drain D3 of Transistor T3. Drains D1, D2, D3, D4, D5 and D6 of respective transistors T1, T2, T3, T4, T5, and T6 are connected to ground as shown.

Drain D1 of transistor T1 is connected to drain D5 of Transistor T5 and is connected to Terminal C and load 540. Drain D6 of Transistor T6 is connected to drain D2 of transistor T2 and is connected to Terminal D and load 570. Drain D3 is connected to load 550 of the delay unit 530 and drain D4 is connected to load 560 of the delay unit 530. Capacitor 580 is connected in parallel between loads 550 and 560 and sources S3 and S4. Additionally, the loads 540, 550, 560 and 570 are connected to a DC voltage source (VDD). Sources S1 and S2 connect to a bias current source B1. Sources S3 and S4 connect to a bias current source B2. Sources S5 and S6 connect to a bias current source B3. The current sources B1, B2, and B3 are, for example, DC bias current generators. While loads 540, 550, 560 and 570 are illustrated as transistors, in one embodiment the transistors 540, 550, 560 and 570 are replaced with resistors.

Figure 6:
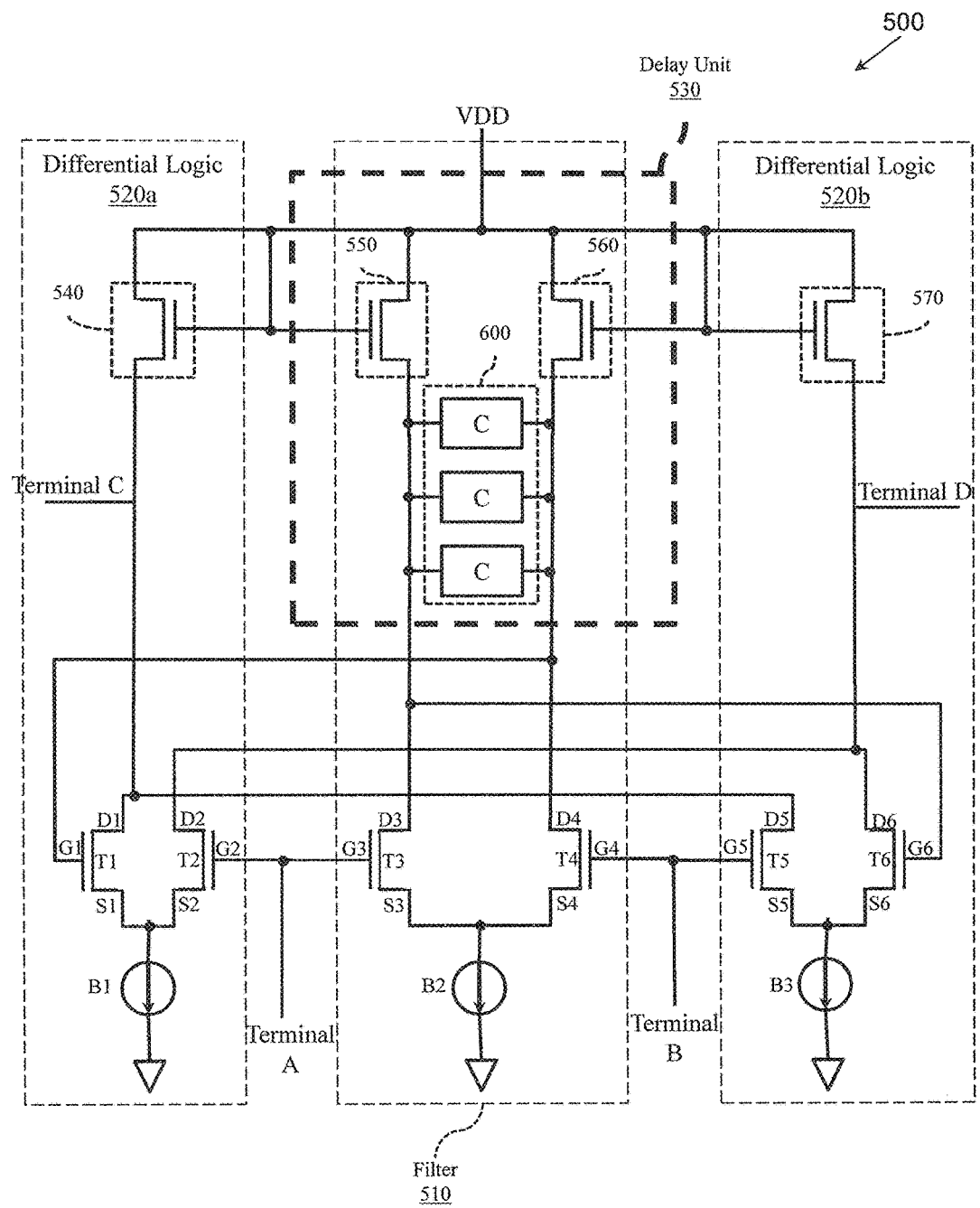
FIG. 6 illustrates one embodiment of a device associated with modifiable continuous-time delay.

Further details of the delay unit 530 will now be discussed in relation to FIG. 6. FIG. 6 illustrates another embodiment of the delay circuit 500. In FIG. 6, the delay unit 530 includes an array of capacitors 600 connected in parallel. The delay circuit 500 of FIG. 6 illustrates three separate capacitor banks, however, in other embodiments, the array 600 may include fewer capacitor banks or more capacitor banks than illustrated.

Each capacitor bank of the array 600 can be, for example, selectively enabled according to a control signal. Selectively enabling different ones of the capacitor banks changes a total capacitance of the delay unit 530 provided between loads 550 and 560. As a result of changing the total capacitance, the timing variable (Td) also changes as shown by Td=2*C/gm. Consequently, changing the total capacitance of the array 600 changes an amount by which the analog input signal is delayed as shown by Equation (3).

Figure 7:
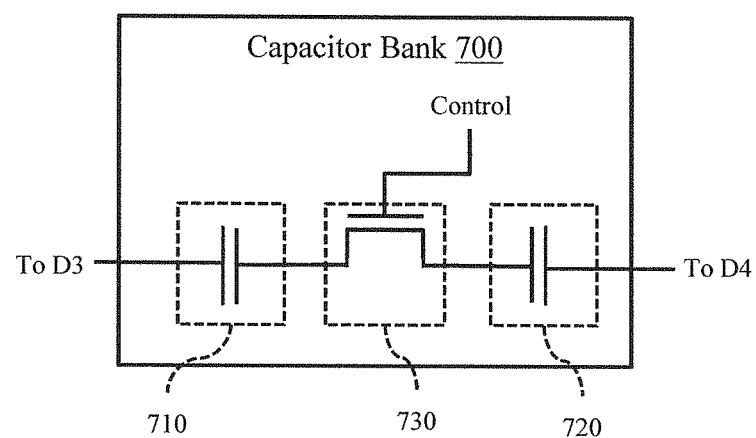
FIG. 7 illustrates one embodiment of a selectively enabled capacitor bank.

With reference to FIG. 7, one embodiment of an individual capacitor bank 700 is shown. The capacitor bank 700 represents one embodiment of an individual capacitor bank from the array 600 of FIG. 6. The capacitor bank 700 includes a first capacitor 710 and a second capacitor 720. The capacitors 710 and 720 may have a same or different capacitance. Additionally, each different capacitor bank may also have a same or different overall capacitance depending on a particular implementation. That is, a first capacitor bank may have a first capacitance, while a second capacitor bank may have a second different capacitance than the first capacitance. Furthermore, while the capacitor bank 700 is illustrated with two capacitors 710 and 720, in another embodiment, the capacitor bank 700 may include only a single capacitor either 710 or 720.

Furthermore, the transistor 730 selectively enables the capacitors 710 and 720 by completing a connection between the capacitors when activated by a control signal on a control terminal. In this way, each capacitor bank of an array can be selectively switched on to modify a total capacitance of the delay unit 530 and consequently change a time delay of the circuit 500.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic" as used herein includes a computer or electrical hardware component(s), firmware, a non-transitory computer storage medium that stores instructions, and/or combinations of these components configured to perform a function(s) or an action(s), and/or to cause a function or action from another logic, method, and/or system. Logic may include a microprocessor controlled by an algorithm, a discrete logic (e.g., ASIC), an analog circuit, a digital circuit, a programmed logic device, a memory device containing instructions that when executed perform an algorithm, and so on. Logic may include one or more gates, combinations of gates, or other circuit components. Where multiple logics are described, it may be possible to incorporate the multiple logics into one physical logic component. Similarly, where a single logic unit is described, it may be possible to distribute that single logic unit between multiple physical logic components. Logic as described herein is limited to statutory subject matter under 35 U.S.C §101.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional actions that are not illustrated in blocks. The methods described herein are limited to statutory subject matter under 35 U.S.C §101.

To the extent that the term "includes" or "including" is employed in the detailed description or the claims, it is intended to be inclusive in a manner similar to the term "comprising" as that term is interpreted when employed as a transitional word in a claim.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or the illustrative examples shown and described. Thus, this disclosure is intended to embrace alterations, modifications, and variations that fall within the scope of the appended claims, which satisfy the statutory subject matter requirements of 35 U.S.C. §101.

What is claimed is:

1. A device, comprising:
   a first terminal connected to an input line, the first terminal to receive an input signal through the input line;
   a first differential pair of transistors comprising a first transistor and a second transistor, wherein a gate of the second transistor is connected to the first terminal;
   a second differential pair of transistors comprising a third transistor and a fourth transistor, wherein a gate of the third transistor is connected to the first terminal;
   a first load connected to a drain of the third transistor;
   a second load connected to a drain of the fourth transistor;
   at least one capacitor connected in parallel between the first load and the second load;
   a second terminal connected to the input line, and wherein a gate of the fourth transistor is connected to the second terminal; and
   a third differential pair of transistors comprising a fifth transistor and a sixth transistor, wherein a gate of the fifth transistor is connected to the second terminal, wherein the transistors are n-channel metal oxide semiconductor (nmos) transistors, and wherein the first load and the second load each have a transconductance that is one-half of a transconductance of a third load and a fourth load.

2. The device of claim 1, further comprising:
   a third load connected to a drain of the first transistor, wherein the drain of the first transistor is connected to a drain of the fifth transistor;
   a third terminal connected to the drain of the first transistor, wherein the third terminal provides an output signal;
   a fourth load connected to a drain of the sixth transistor; and
   a fourth terminal connected to the drain of the sixth transistor, wherein the fourth terminal provides the output signal, and wherein the drain of the sixth transistor is connected to a drain of the second transistor.

3. The device of claim 1, further comprising:
   a delay unit connected in parallel between the drain of the third transistor and the drain of the fourth transistor, the delay unit including a plurality of parallel lines with each of the plurality of parallel lines including at least one capacitor connected in series with a transistor.

4. The device of claim 2, wherein the first load, the second load, the third load and the fourth load are transistors connected to a voltage source, and wherein the device provides continuous-time delay of the input signal.

5. The device of claim 2, wherein the first terminal and the second terminal receive the input signal in opposing polarities, and wherein the third terminal and the fourth terminal provide the output signal in opposing polarities.

6. The device of claim 1, wherein a source of the first transistor, a source of the second transistor, a source of the third transistor, a source of the fourth transistor, a source of the fifth transistor, and a source of the sixth transistor are connected DC bias current generators.

7. An apparatus, comprising:
   filter logic configured to adjust an analog signal to produce an adjusted signal according to a timing variable configured by a delay unit, wherein the timing variable is a ratio between (i) a total capacitance of connected capacitors in the delay unit and (ii) a transconductance of transistors in the delay unit, wherein a first capacitor is connected between a first transistor and a second transistor and, wherein the ratio is based at least in part on a first capacitance of the first capacitor and a first transconductance of the first transistor; and differential logic configured to subtract the analog signal from the adjusted signal to generate, in continuous-time, an output signal with a time delay that is a function of the timing variable, wherein the delay unit includes delay logic configured to dynamically modify the total capacitance to change the timing variable and a resulting time delay by which the analog signal is adjusted.

8. The apparatus of claim 7, the delay unit comprising:

an array of capacitors connected in parallel, wherein each capacitor has an associated capacitance; and the delay logic connected to the array of capacitors and configured to individually activate capacitors in the array to dynamically modify the timing variable, wherein the delay logic is configured to selectively activate capacitors as a function of a control signal.

9. The apparatus of claim 7, wherein the delay logic is configured to dynamically modify the total capacitance to change the ratio and the resulting time delay by which the analog signal is adjusted.

10. The apparatus of claim 7, wherein the apparatus is a high speed wire-line communication device and the analog signal is a communication signal processed by the high speed wire-line communication device.

11. The apparatus of claim 7, wherein the apparatus is a hard-disk drive and the analog signal is a signal in a read channel of the hard-disk drive.

12. A method, comprising:

adjusting an analog signal to produce an adjusted signal according to a timing variable, wherein the timing variable is a ratio between (i) a total capacitance of connected capacitors and (ii) a transconductance of transistors, wherein a first capacitor of the connected capacitors is connected between a first transistor of the transistors and a second transistor of the transistors and, wherein the ratio is based at least in part on a first capacitance of the first capacitor and a first transconductance of the first transistor;

subtracting the analog signal from the adjusted signal to generate an output signal with a time delay that is a function of the timing variable; and dynamically modifying the total capacitance to change the timing variable and a resulting time delay by which the analog signal is adjusted.

13. The method of claim 12, wherein dynamically modifying the total capacitance includes individually activating capacitors in a parallel array of capacitors to dynamically modify the total capacitance as a function of a control signal.

14. The method of claim 13, wherein dynamically modifying the total capacitance changes the ratio and the resulting time delay by which the analog signal is adjusted.

15. The method of claim 12, wherein the adjusting is performed by a circuit that is connected to a high speed wire-line communication device, and wherein the analog signal is a communication signal.

16. The method of claim 12, wherein the adjusting is performed by a circuit that is connected to a hard-disk drive, and wherein the analog signal is a signal in a read channel of the hard-disk drive.

\* \* \* \* \*